(12) United States Patent
Bittner et al.

(10) Patent No.: US 12,118,267 B2
(45) Date of Patent: Oct. 15, 2024

(54) AUTOMATICALLY GENERATED MEDIA PREVIEW

(71) Applicant: Spotify AB, Stockholm (SE)

(72) Inventors: Rachel Bittner, Brooklyn, NY (US); Tristan Jehan, Brooklyn, NY (US)

(73) Assignee: Spotify AB, Stockholm (SE)

( * ) Notice: Subject to any disclaimer, the term of this patent is extended or adjusted under 35 U.S.C. 154(b) by 319 days.

(21) Appl. No.: 17/497,429

(22) Filed: Oct. 8, 2021

(65) Prior Publication Data

US 2022/0100461 A1    Mar. 31, 2022

Related U.S. Application Data

(63) Continuation of application No. 16/717,685, filed on Dec. 17, 2019, now Pat. No. 11,169,767, which is a continuation of application No. 15/721,231, filed on Sep. 29, 2017, now Pat. No. 10,545,720.

(51) Int. Cl.

| | |
|---|---|
| *G06F 3/16* | (2006.01) |
| *G06F 3/0481* | (2022.01) |
| *G11B 27/022* | (2006.01) |
| *H03G 3/30* | (2006.01) |
| *H03G 5/16* | (2006.01) |
| *H04N 21/8549* | (2011.01) |

(52) U.S. Cl.
CPC ............ *G06F 3/165* (2013.01); *G06F 3/0481* (2013.01); *G11B 27/022* (2013.01); *H03G 3/3005* (2013.01); *H03G 5/165* (2013.01); *H04N 21/8549* (2013.01); *G10H 2210/111* (2013.01); *G10H 2210/391* (2013.01)

(58) Field of Classification Search
CPC ......... G06F 16/683; G06F 3/165; G06F 16/68
USPC ........................................................ 700/94
See application file for complete search history.

(56) References Cited

U.S. PATENT DOCUMENTS

| | | |
|---|---|---|
| 6,587,127 B1 | 7/2003 | Leeke |
| 6,897,221 B2 | 5/2005 | Crooks |
| 6,987,221 B2 | 1/2006 | Platt |
| 7,825,322 B1 * | 11/2010 | Classen ................. H04H 60/04 84/625 |
| 8,280,539 B2 | 10/2012 | Jehan |
| 9,002,175 B1 | 4/2015 | Raj |
| 9,110,955 B1 | 8/2015 | Bernhardsson |
| 9,547,679 B2 | 1/2017 | Whitman |
| 9,635,337 B1 | 4/2017 | Dantzler |
| 10,070,194 B1 | 9/2018 | Dodge |
| 10,545,720 B2 | 1/2020 | Bittner |

(Continued)

OTHER PUBLICATIONS

Cambridge Advanced Learner's Dictionary and Thesaurus definition for individual, retrieved Feb. 25, 2021, 1 page. (cited by Examiner in Mar. 2, 2021 in U.S. Appl. No. 16/717,685), no date.

*Primary Examiner* — Alexander Krzystan

(74) *Attorney, Agent, or Firm* — Merchant & Gould P.C.

(57) ABSTRACT

Systems, devices, apparatuses, components, methods, and techniques for automatically generating media previews are provided. An example media system for automatically generating media previews for a particular artist include a trailer generation application configured to receive input specifying an artist and duration of a trailer, automatically select clips from two or more media items by the artist, and automatically arrange and combine the clips into a media trailer for later playback.

20 Claims, 15 Drawing Sheets

(56) References Cited

U.S. PATENT DOCUMENTS

| | | |
|---|---|---|
| 10,748,206 B1 | 8/2020 | Cooper |
| 11,169,767 B2 | 11/2021 | Bittner |
| 2002/0082901 A1 | 6/2002 | Dunning |
| 2005/0235811 A1 | 10/2005 | Dukane |
| 2007/0074618 A1 | 4/2007 | Vergo |
| 2008/0075303 A1* | 3/2008 | Kim .................... G10H 1/125 381/103 |
| 2008/0077482 A1 | 3/2008 | Tota |
| 2008/0221942 A1 | 9/2008 | Agnihotri |
| 2008/0242221 A1 | 10/2008 | Shapiro |
| 2008/0242280 A1 | 10/2008 | Shapiro |
| 2009/0044689 A1 | 2/2009 | Komori |
| 2010/0070917 A1 | 3/2010 | Gates |
| 2011/0035223 A1* | 2/2011 | Schiller .................. G06F 16/68 704/260 |
| 2011/0125763 A1 | 5/2011 | Takanen |
| 2012/0322041 A1 | 12/2012 | Weisman |
| 2012/0323716 A1 | 12/2012 | Matthews |
| 2013/0254065 A1 | 9/2013 | Harbick |
| 2013/0262469 A1 | 10/2013 | Whitman |
| 2013/0266290 A1 | 10/2013 | Sathish |
| 2014/0180762 A1 | 6/2014 | Gilbert |
| 2014/0195544 A1 | 7/2014 | Whitman |
| 2014/0307878 A1 | 10/2014 | Osborne |
| 2015/0312354 A1* | 10/2015 | Boyle .................... H04L 67/02 709/219 |
| 2015/0339301 A1* | 11/2015 | Paalborg ................. G06F 16/44 715/716 |
| 2016/0094884 A1 | 3/2016 | Westbrook |
| 2016/0112761 A1* | 4/2016 | Venkataraman ..... H04N 21/252 725/14 |
| 2016/0179950 A1* | 6/2016 | Carmichael ......... G06F 16/5866 707/732 |
| 2016/0224665 A1 | 8/2016 | Shapira |
| 2017/0041654 A1 | 2/2017 | Steinberg |
| 2017/0242653 A1 | 8/2017 | Lang |
| 2018/0130075 A1 | 5/2018 | Roy |
| 2018/0188916 A1 | 7/2018 | Lyons |
| 2018/0330756 A1 | 11/2018 | MacDonald |
| 2018/0376171 A1 | 12/2018 | Dhandapani |

* cited by examiner

AUTOMATICALLY GENERATED MEDIA PREVIEW

CROSS-REFERENCE TO RELATED APPLICATION(S)

This application is a continuation of U.S. patent application Ser. No. 16/717,685, filed Dec. 17, 2019, which is a continuation of U.S. patent application Ser. No. 15/721,231, filed Sep. 29, 2017, U.S. Pat. No. 10,545,720, the disclosures of which are hereby incorporated by reference in their entireties. To the extent appropriate, a claim of priority is made to the above disclosed applications.

BACKGROUND

People in the music industry want to promote music-related events to people who listen to music. A good way to do this is by providing previews of an artist's music. However, producing trailers or previews of a particular artist's music can be time-consuming and costly for promoters. Promoters need a quick, easy way to provide a preview of an artist's music to a listener to promote an event associated with that artist.

SUMMARY

In general terms, this disclosure is directed to automatically generating media trailers of an artist's music. In one possible configuration and by non-limiting example, a promoter provides input specifying an artist and a duration of a trailer to a server computer, which automatically generates a trailer, or preview, of that artist's music by combining multiple clips of that artist's songs into one cohesive media item. Various aspects are described in this disclosure, which include, but are not limited to, the following aspects.

In one aspect, method of generating a media trailer comprises receiving input from a user specifying one or more artists and a duration of the media preview. The input is used to automatically select one or more representative media items for the one or more artists and automatically select clips of those representative media items. Then the clips are automatically arranged and equalized to generate the media trailer.

In another aspect, one or more computer readable media encode instructions that cause a computing device to receive a selection of one or more musical artists, receive an input specifying a duration of an artist trailer, and receive an input of additional media content related to an event involving the one or more musical artists. The computing device automatically selects one or more representative songs for the one or more musical artists and selects portions of each song to include in the artist trailer. The portions of the songs are automatically arranged and equalized. The additional media content is integrated with the portions of the songs to produce the artist trailer and then a preview of the artist trailer is presented.

In yet another aspect, a system for generating an artist trailer comprises a trailer generation application and a media server application. The trailer generation application is configured to receive input from a promoter specifying an artist and a duration for the artist trailer, automatically select clips from two or more songs by the artist, and automatically arrange and combine the clips into an artist trailer. The media server application is configured to communicate media content and artist trailers to a consumer. In some embodiments the system further comprises a computing device and a media-playback device.

DETAILED DESCRIPTION

Figure 1:
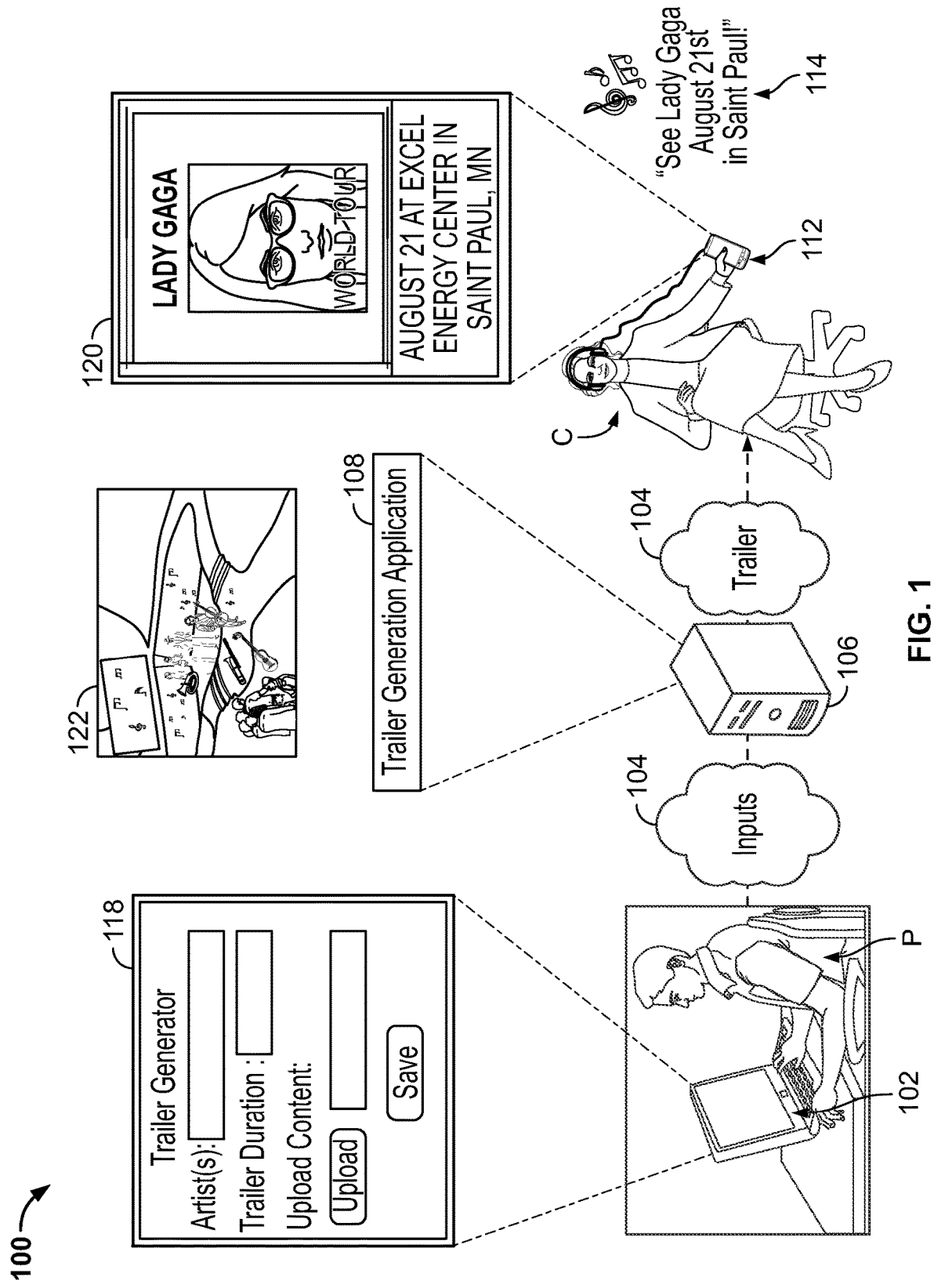
FIG. 1 illustrates an example system for automatically generating media trailers.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

Trailers or previews are effective tools for providing an audience with a sample of a particular media content item or collection of media content items. In some instances, trailers are used to provide a preview of media content that is going to be released to the public. In other instances, trailers serve as a reminder of media content that an audience might already be familiar with.

Music trailers could be utilized to promote a particular artist or group of artists. In one example, a trailer could provide a preview of music that is going to be released in an upcoming album for a particular artist. In another example, a trailer could remind an audience of the music that one or more artists have created that might be featured in an upcoming live performance. The trailer could feature more than one artist if multiple artists are featured in the live performance. In another example, a trailer could provide a preview of music by a new artist to attract listeners.

Events related to a particular artist are preferably promoted to an audience that listens to that particular artist. Multiple platforms are available to reach such an audience. For example, a media trailer could be played between songs on a music streaming service. In another example, a media trailer could be played on social media platforms such as Snapchat or Facebook. Many such platforms allow for targeted promotion of individuals that might be particularly interested in learning about an event relating to an artist that the individuals enjoy listening to. In some embodiments, the event is a concert or performance. In other embodiments, the event is the release of a new album or the addition of a new artist to a music streaming service.

Promoters want to quickly and easily generate media trailers that are targeted to particular audience. It is costly and time consuming to create customized promotional media previews for every event and every audience. In some embodiments, a system automates several steps of this process for promoters. By providing some simple inputs, a promoter can specify criteria for a customized media trailer that is automatically generated. The promoter can include detailed additional content to customize the media trailer for a particular event. In other embodiments, media trailers are automatically generated with little or no input from a promoter. For example, a new artist may be available on a music streaming service and a media trailer is automatically generated from the artist's music to enable listeners to quickly preview the new music.

FIG. 1 illustrates an example system for automatically generating media trailers. A promoter P utilizes a computing device 102 to enter input into a user interface 118. The input specifies criteria for a media trailer that will be used to promote the event 122. The media server 106 receives the input through a network 104 and a trailer generation application 108 automatically generates a media trailer. The media trailer is then communicated through the network 104 to a consumer 110 via a media-playback device 112. The media-playback device 112 plays the media trailer 120 which includes information about the event 122, which is a Lady Gaga concert in this example.

The network 104 is an electronic communication network that facilitates communication between the computing device 102, the media server 106, and the media-playback device 112. An electronic communication network includes a set of computing devices and links between the computing devices. The computing devices in the network use the links to enable communication among the computing devices in the network. The network can include routers, switches, mobile access points, bridges, hubs, intrusion detection devices, storage devices, standalone server devices, blade server devices, sensors, desktop computers, firewall devices, laptop computers, handheld computers, mobile telephones, vehicular computing devices, and other types of computing devices.

In various embodiments, the network 104 includes various types of links. For example, the network 104 can include wired and/or wireless links, including Bluetooth, ultra-wideband (UWB), 802.11, ZigBee, cellular, and other types of wireless links. Furthermore, in various embodiments, the network 104 is implemented at various scales. For example, the network 104 can be implemented as one or more local area networks (LANs), metropolitan area networks, subnets, wide area networks (such as the Internet), or can be implemented at another scale. Further, in some embodiments, the network 106 includes multiple networks, which may be of the same type or of multiple different types.

Figure 2:
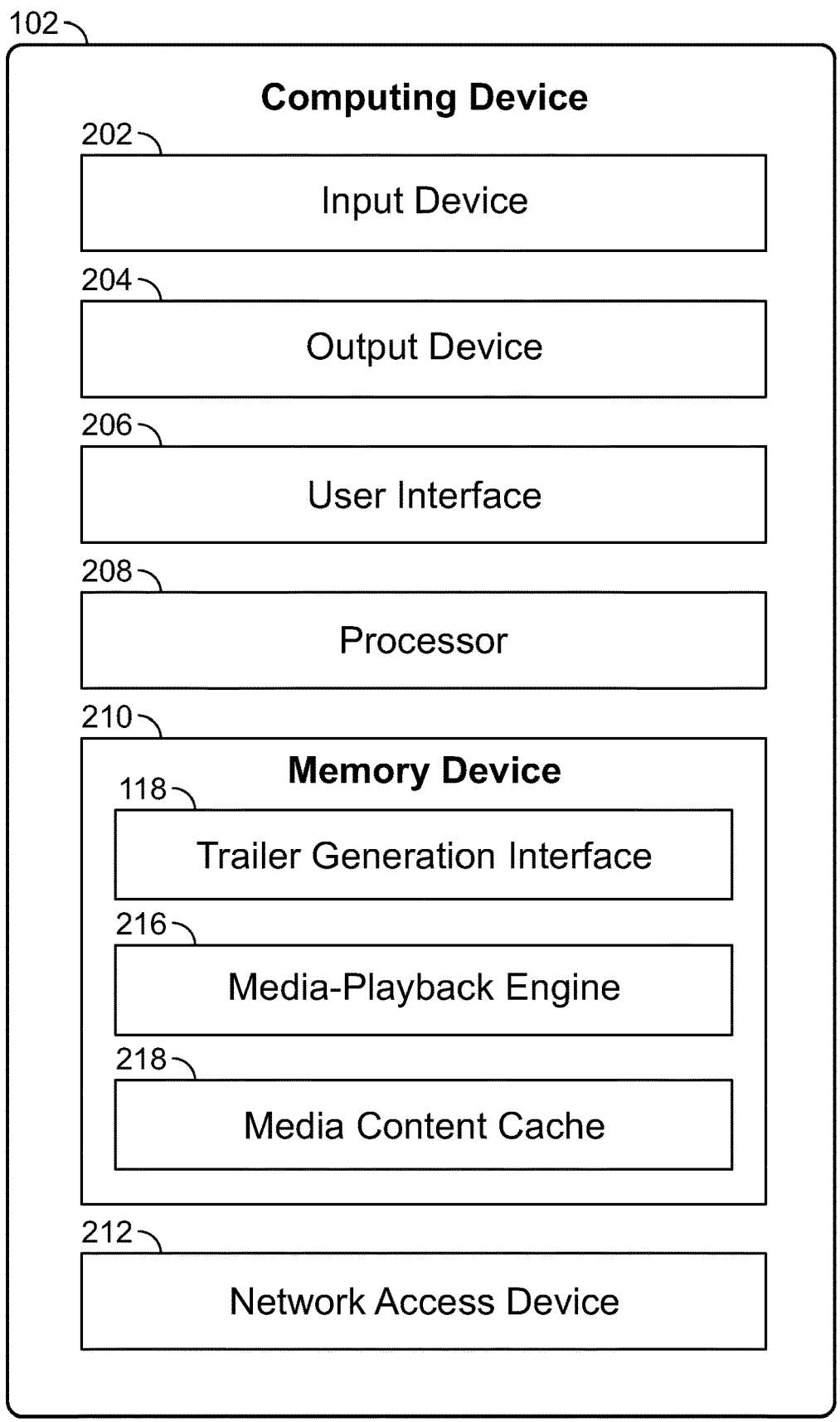
FIG. 2 is a schematic block diagram of the computing device 102 of FIG. 1.

FIG. 2 is a schematic block diagram of the computing device 102 of FIG. 1. The computing device 102 may be used by an individual who wishes to generate a media trailer. The media trailer may be utilized to promote a particular event associated with a particular artist. In some embodiments, a promoter wants to generate a preview of a concert featuring more than one artist. In such instances, a trailer may include clips of songs from multiple artists that are involved in the concert.

The computing device 102 includes an input device 202. The input device 202 receives inputs from a user. The input device 202 is one or more of a keyboard, a touchscreen, a voice recorder, and a mouse. The output device 204 provide audio and visual output. The output device 204 is one or more of a display, a speaker, headphones, a touchscreen, and other audio outputs. In some embodiments, a touch screen operates as both an output device and a user input device. In some embodiments, user input is not required and the media trailer is automatically generated.

In at least some embodiments, the computing device 104 includes a processor 208 and a memory device 210. In some embodiments, the processor 208 comprises one or more central processing units (CPU). In other embodiments, the processor 208 additionally or alternatively includes one or more digital signal processors, field-programmable gate arrays, or other electronic circuits. The processor 208 executes instructions stored in the memory device 210.

The memory device 210 operates to store data and instructions. In some embodiments, the memory device 210 stores instructions for a trailer generation interface 118, and a media-playback engine 216. In some embodiments, the media-playback engine 170 selects and plays back media content and generates interfaces for selecting and playing back media content items.

The trailer generation interface 118 prompts a user to input information utilized to produce an artist trailer. In some embodiments the user is prompted to enter one or more artists whose songs are to be included in the trailer. The user may also be prompted to specify a duration of the trailer. This process is further described with respect to FIG. 6. The trailer generation interface 118 also plays previews of media trailers and enables users to edit the trailers. In some embodiments, the trailer generation interface 118 is not utilized because the media trailer is automatically generated based on pre-defined criteria. For example, an artist trailer may be automatically generated when a new artist becomes available on a music streaming service and the criteria are pre-defined by the music streaming service.

Some embodiments of the memory device also include a media content cache 218. The media content cache 218 stores media-content items, such as media content items that have been previously received from the media server application 302. The media content items stored in the media content cache 218 may be stored in an encrypted or unencrypted format. The media content cache 218 can also store decryption keys for some or all of the media content items that are stored in an encrypted format. The media content cache 218 can also store metadata about media-content items such as title, artist name, album name, length, genre, mood, era, etc. The media content cache 218 can also store playback information about the media content items, such as the number of times the user has requested to playback the media content item or the current location of playback (e.g., when the media content item is an audiobook, podcast, or the like for which a user may wish to resume playback). In some embodiments, the playlist can be stored in the media content cache 218 for later playback.

The memory device 210 typically includes at least some form of computer readable media. Computer readable media includes any available media that can be accessed by the computing device 102. By way of example, computer readable media include computer readable storage media and computer readable communication media.

Computer readable storage media includes volatile and nonvolatile, removable and non-removable media implemented in any device configured to store information such as computer readable instructions, data structures, program modules, or other data. Computer readable storage media includes, but is not limited to, random access memory, read only memory, electrically erasable programmable read only memory, flash memory and other memory technology, compact disc read only memory, blue ray discs, digital versatile discs or other optical storage, magnetic cassettes, magnetic tape, magnetic disk storage or other magnetic storage devices, or any other medium that can be used to store the desired information and that can be accessed by the computing device 102. In some embodiments, computer readable storage media is non-transitory computer readable storage media.

Computer readable communication media typically embodies computer readable instructions, data structures, program modules or other data in a modulated data signal such as a carrier wave or other transport mechanism and includes any information delivery media. The term "modulated data signal" refers to a signal that has one or more of its characteristics set or changed in such a manner as to encode information in the signal. By way of example, computer readable communication media includes wired media such as a wired network or direct-wired connection, and wireless media such as acoustic, radio frequency, infrared, and other wireless media. Combinations of any of the above are also included within the scope of computer readable media.

The network access device 212 operates to communicate with other computing devices over one or more networks 104. Examples of the network access device 212 include one or more wired network interfaces and wireless network interfaces. Examples of wireless network interfaces include infrared, BLUETOOTH® wireless technology, 802.11a/b/g/n/ac, and cellular or other radio frequency interfaces.

Figure 3:
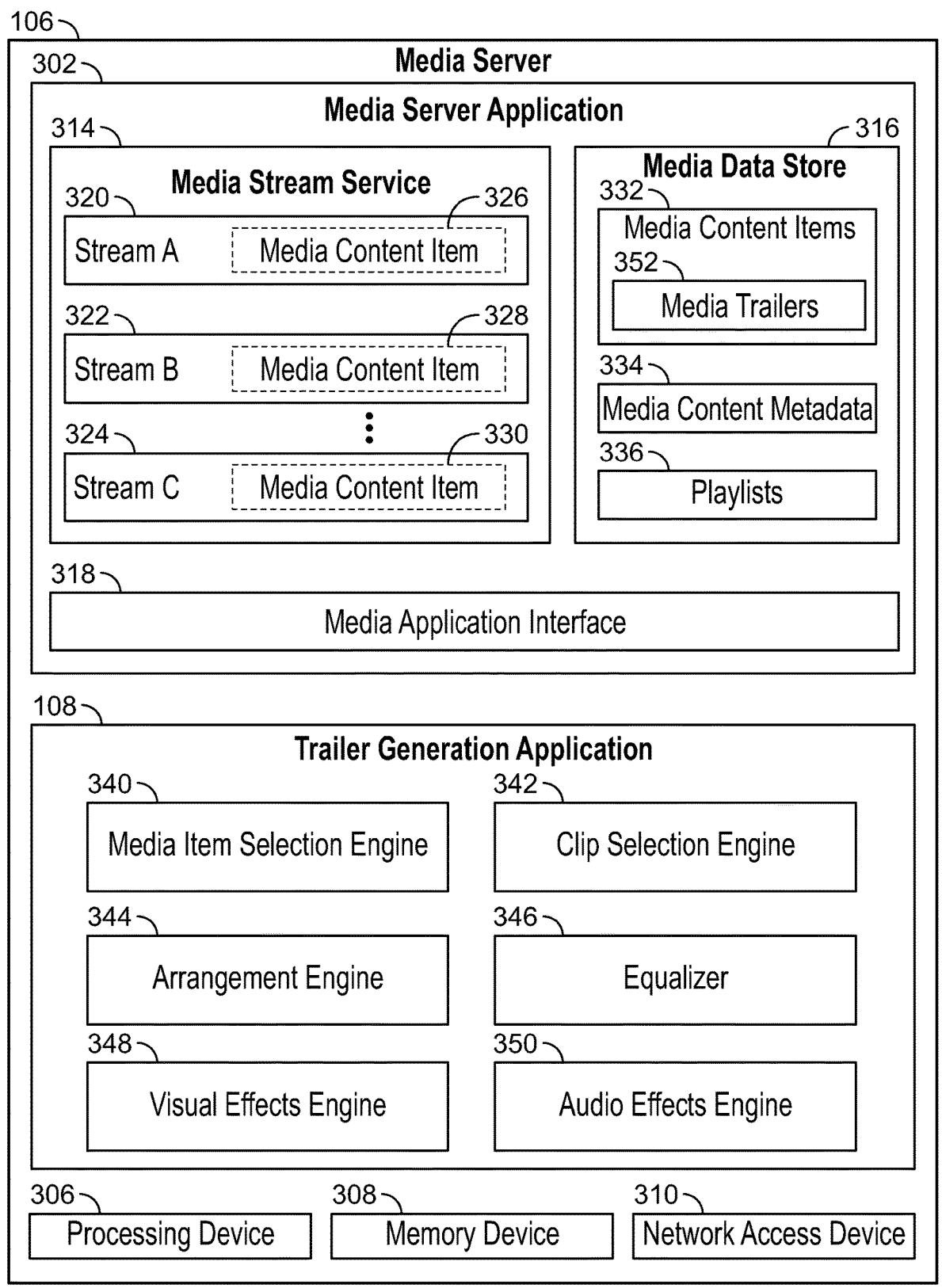
FIG. 3 is a schematic block diagram of the media server of FIG. 1.

FIG. 3 is a schematic block diagram of the media server of FIG. 1. The media server 106 transmits stream media to media-playback devices such as the media-playback device 112. The media server 106 also generates media trailers based on inputs received from computing devices such as the computing device 102. In some embodiments, the media server 106 includes a media server application 302, a trailer generation application 108, a processing device 306, a memory device 1308, and a network access device 310. The processing device 306, memory device 308, and network access device 310 may be similar to the processor 208, memory device 210, and network access device 212 respectively, which have each been previously described.

In some embodiments, the media server application 302 accesses and streams music or other audio, video, or other forms of media content. The media server application 302 includes a media stream service 314, a media data store 316, and a media application interface 318. The media stream service 314 operates to buffer media content such as media content items 326, 328, and 330, for streaming to a media-playback device 112.

The media application interface 318 can receive requests or other communication from media-playback devices or other systems, to retrieve media content items from the media server 106.

In some embodiments, the media data store 316 stores media content items 332, media content metadata 334, and playlists 336. The media data store 316 may comprise one or more databases and file systems. The media content items 332 may be audio, video, or any other type of media content, which may be stored in any format for storing media content.

The media content metadata 334 operates to provide various information associated with the media content items 332. In some embodiments, the media content metadata 334 includes one or more of title, artist name, album name, length, genre, mood, era, etc. In some embodiments, the media content metadata 334 includes characteristics about media content relevant to its energy level or popularity. In some embodiments, the media content metadata 334 records information about one or more users' preferences related to a media content item.

The playlists 336 operate to identify one or more of the media content items 332 and assemble the media content items together into a playlist. In some embodiments, the playlists 336 identify a group of the media content items 332 in a particular order. In other embodiments, the playlists 336 merely identify a group of the media content items 332 without specifying a particular order. Some, but not necessarily all, of the media content items 332 included in a particular one of the playlists 336 are associated with a common characteristic such as a common genre, mood, era, or appropriateness for particular activities. The playlists 336 may include user-created playlists, which may be available to a particular user, a group of users, or to the public.

The trailer generation application 108 communicates with the computing device 102 and the media-playback device 112 to present automatically generated media trailers. In some embodiments, criteria for the media trailer is received from the computing device 102. In other embodiments, the criteria is pre-defined and stored at the media server. In some embodiments, the criteria specifies one or more musical artists and a duration of a trailer or media preview. Based on this criteria, the media item selection engine 340 selects two or more media content items to include in the media trailer. The media item selection engine 340 utilizes media content metadata 334 to select media content items 332 from the media data store 316. After the media content items 332 have been selected, the clip selection engine 342 analyzes the media content items 332. Portions of the media content items 332 are selected to be included in the artist trailer.

Once the clips have been selected, the arrangement engine 344 automatically puts the clips in order and creates transitions between the clips. The order of the clips may be determined by one or more of energy, tempo, and popularity. The transitions are created by fading in and out as well as optionally matching beats. The equalizer 346 normalizes the volume and levels of the media content to match them together.

In some embodiments, the visual effects engine 348 receives visual content from the computing device 102 and adds the visual content to the media trailer. The visual content may be one or more of an image and a video. For example, to promote a concert, the visual content may be a concert poster image. In some embodiments, the audio effects engine 350 receives audio content from the computing device 102 and adds the audio content to the artist trailer. The audio content is typically spoken or verbal content. The spoken content may describe an event associated with one or more artists such as a concert or an album release. In some embodiments, the spoken content is recorded by the same artist that is being promoted by the trailer.

Figure 4:
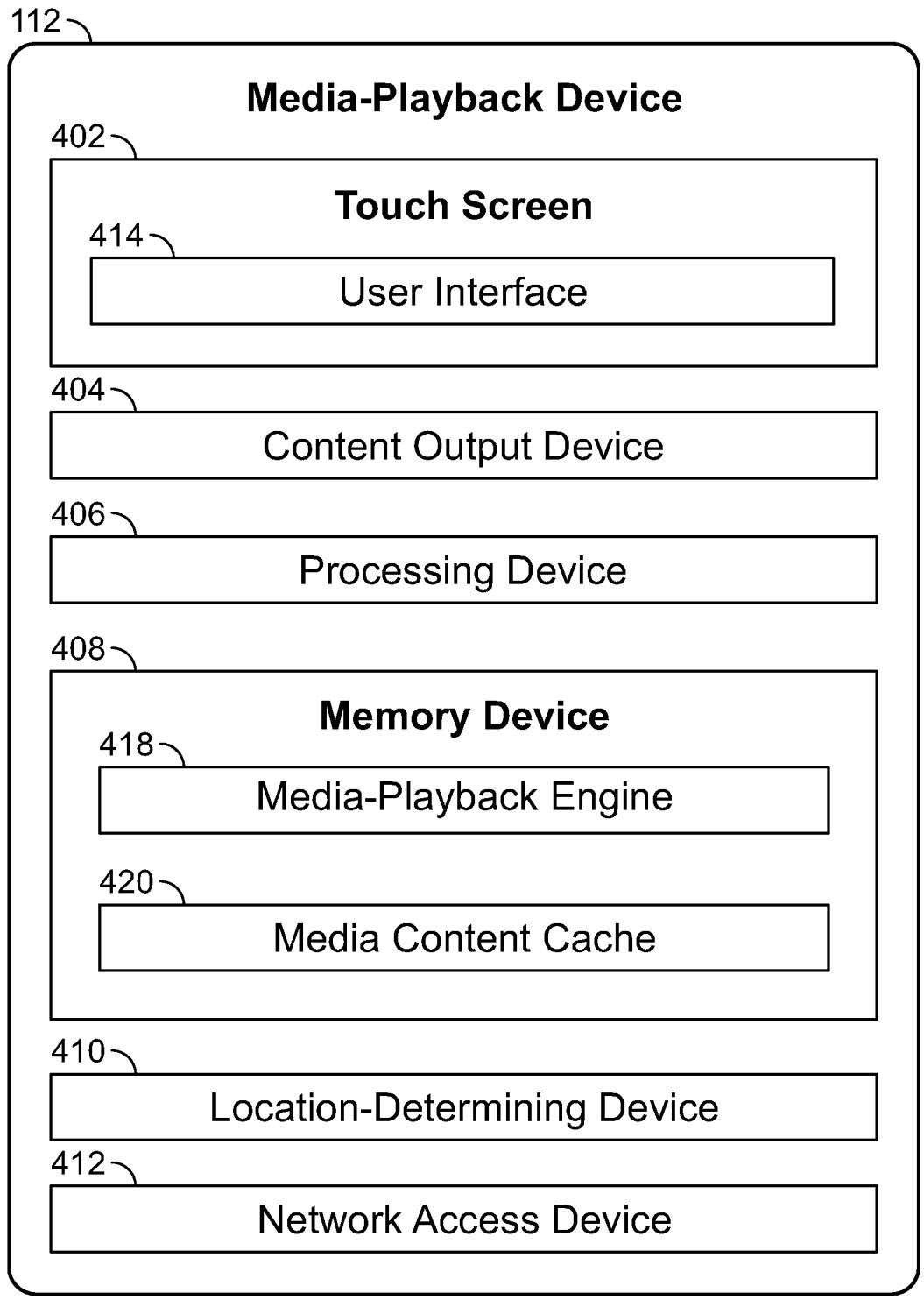
FIG. 4 is a schematic block diagram of the media-playback device of FIG. 1.

FIG. 4 is a schematic block diagram of the media-playback device 112 of FIG. 1. In some embodiments, the media-playback device 112 includes a touch screen 402, a content output device 404, a processing device 406, a memory device 408, a location-determining device 410, and a network access device 412.

The touch screen 402 operates to receive inputs from a selector (e.g., a finger, stylus, etc.) controlled by a user such as the consumer C. In some embodiments, the touch screen 402 operates as both a display device and a user input device. In some embodiments, the touch screen 402 detects inputs based on one or both of touches and near-touches. In some embodiments, single taps and/or swipes are recognized as inputs. In some embodiments, the touch screen 402 displays a user interface 414 for interacting with the media-playback device 112. Some embodiments do not include a touch screen 402. Some embodiments include a display device and one or more separate user interface devices. Further, some embodiments do not include a display device.

The content output device 404 operates to output media content. In some embodiments, the content output device 404 generates media output 114 for the consumer C. Examples of the content output device 404 include a speaker assembly comprising one or more speakers, an audio output jack, a Bluetooth transmitter, a display panel, and a video output jack. Other embodiments are possible as well. For example, the content output device 404 may transmit a signal through the audio output jack or Bluetooth transmitter that can be used to reproduce an audio signal by a connected or paired device such as headphones, speaker system, or vehicle media-playback system.

In some embodiments, the processing device 406 comprises one or more central processing units (CPU). In other embodiments, the processing device 406 additionally or alternatively includes one or more digital signal processors, field-programmable gate arrays, or other electronic circuits.

The processing device 406, memory device 408, and network access device 412 may be similar to the processor 208, memory device 210, and network access device 212 respectively, which have each been previously described.

The memory device 408 includes a media-playback engine 408 and a media content cache 420. The media-playback engine 408 and the media content cache 420 may be similar to the media-playback engine 216 and the media content cache 218, which have each been previously described. In some embodiments, the media-playback engine 418 receives and plays media content received from the media server 106. The media content includes artist trailers generated by the media server 106. In some embodiments, artist trailers are played between songs or other media content that are streamed from the media server 105 to the media-playback engine 418.

The location-determining device 410 is a device that determines the location of the media-playback device 112. In some embodiments, the location-determining device 410 uses one or more of the following technologies: Global Positioning System (GPS) technology, cellular triangulation technology, network-based location identification technology, Wi-Fi positioning systems technology, and combinations thereof.

The network access device 412 may be similar to the network access device 212, which has been previously described.

Each of the computing device 104, media server 106, and media-playback device 112 can include additional physical computer or hardware resources. In at least some embodiments, the media-playback device 112 and computing device 104 communicates with the media server 106 via the network 104

Although in FIG. 2 only a single media-playback device 112, a single computing device 102, and a single media server 106 are shown, in accordance with some embodiments, the media server 106 can support the simultaneous use of multiple media-playback devices and computing devices. The media-playback device and computing device can simultaneously access media content from multiple media servers.

Figure 5:
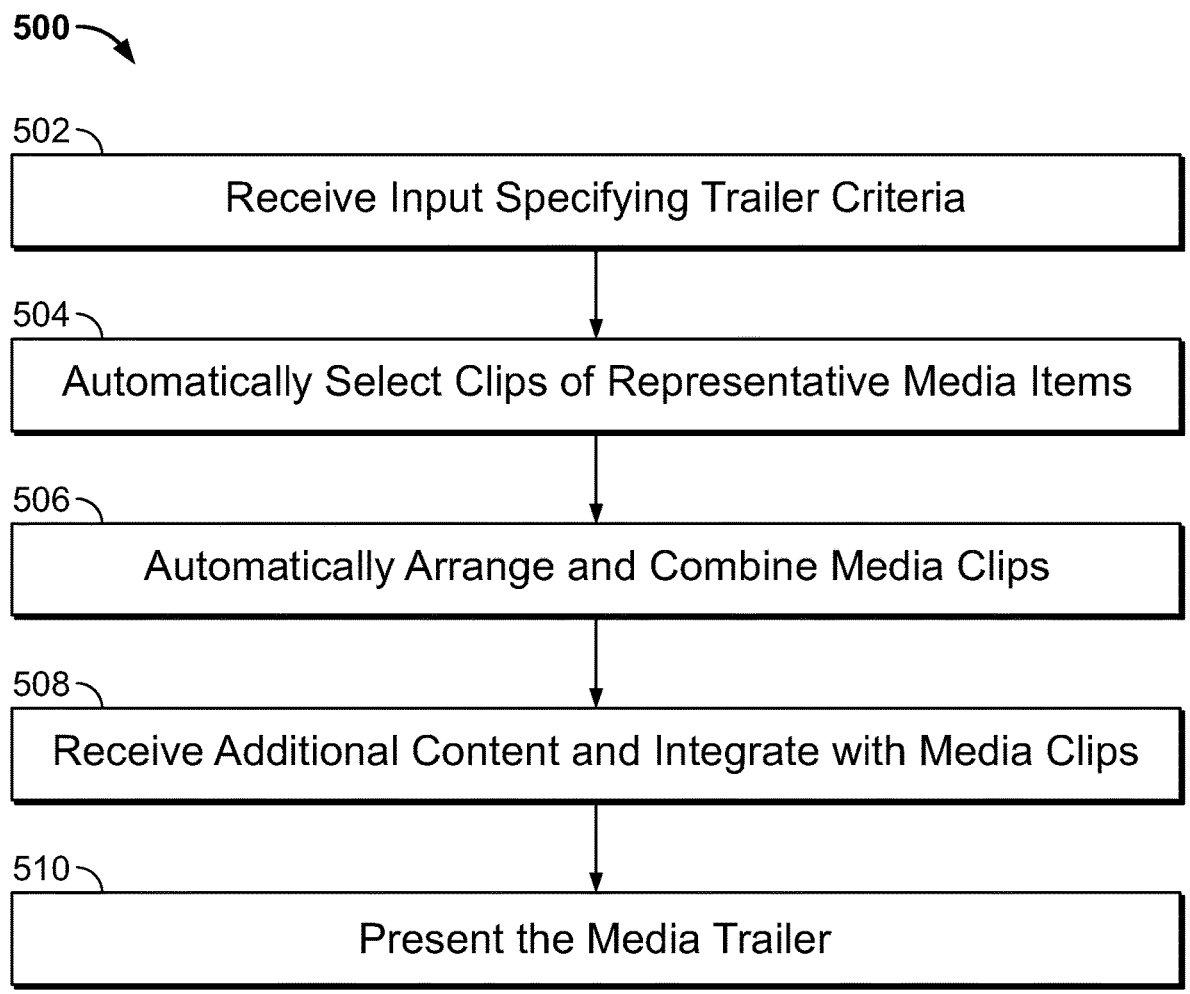
FIG. 5 illustrates an example method of automatically generating a media trailer performed by some embodiments of the trailer generation application of FIG. 3.

FIG. 5 illustrates an example method 500 of automatically generating a media trailer performed by some embodiments of the trailer generation application 108. Such a method can be used, for example, to build a media trailer to promote a particular event associated with an artist. A promoter may wish to promote an upcoming tour for a particular artist by presenting previews of popular songs by the artist to consumers that like to listen to streamed music. However, the promoter may not have the time or ability to put together an effective preview of the artist's music. The promoter may be using a computing device, such as the computing device 102 of FIG. 1 to input criteria for the media trailer. The criteria is communicated to a media server such as the media server 106 in FIG. 1 to automatically generate a media trailer for the artist. The promoter may desire that the media server 106 communicate the automatically generated artist trailer to consumers listening to media content on media-playback devices such as the media-playback device 112 of FIG. 1. In some embodiments, some of the operations of the method 500 are automated and do not require input from a user to generate the media trailer.

Figure 6:
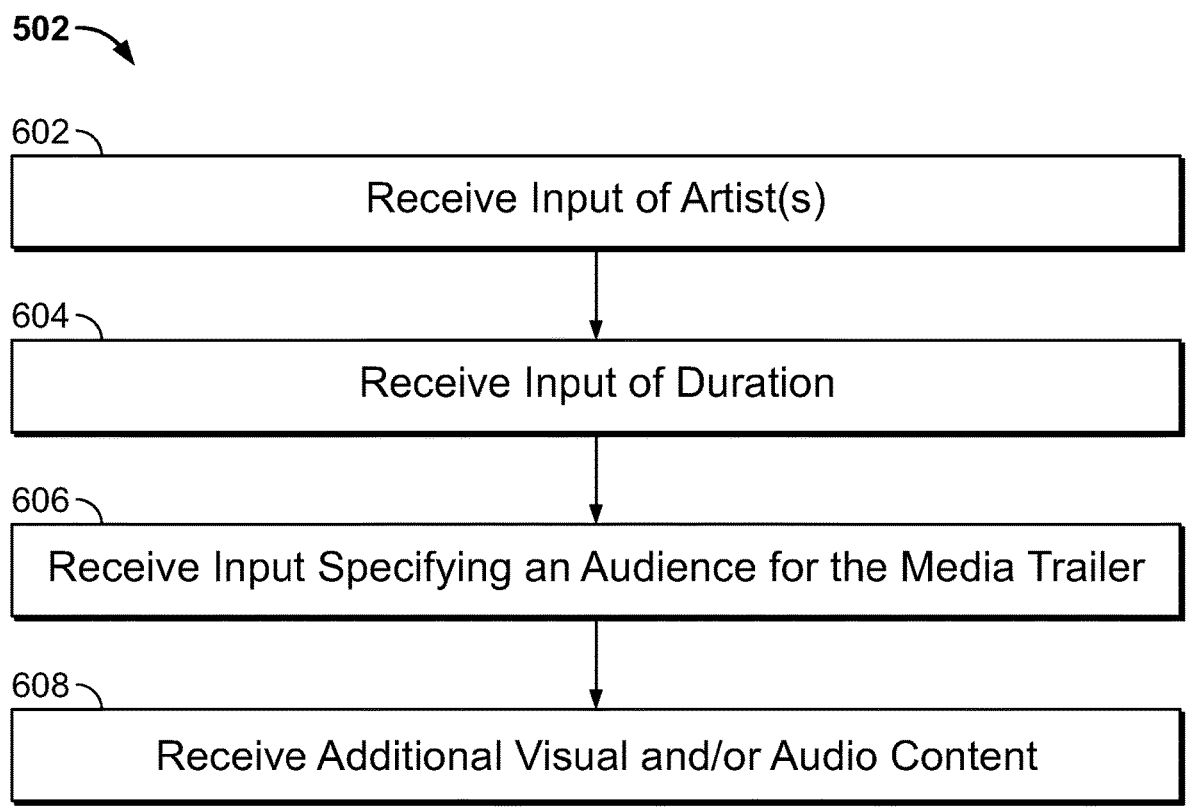
FIG. 6 illustrates an example method of receiving input of trailer criteria performed by some embodiments of the trailer generation application of FIG. 3.

At operation 502, the media server 106 receives inputs from the computing device 102 specifying one or more artists to include in the media trailer. Input specifying a duration for the trailer is also received. The duration determines the amount of media content that can be included in the program. FIG. 6 further describes receiving input from a computing device specifying criteria for a media trailer. Alternatively, in some embodiments, the artists and duration are automatically selected based on pre-defined criteria stored at the media server 106.

Figure 8:
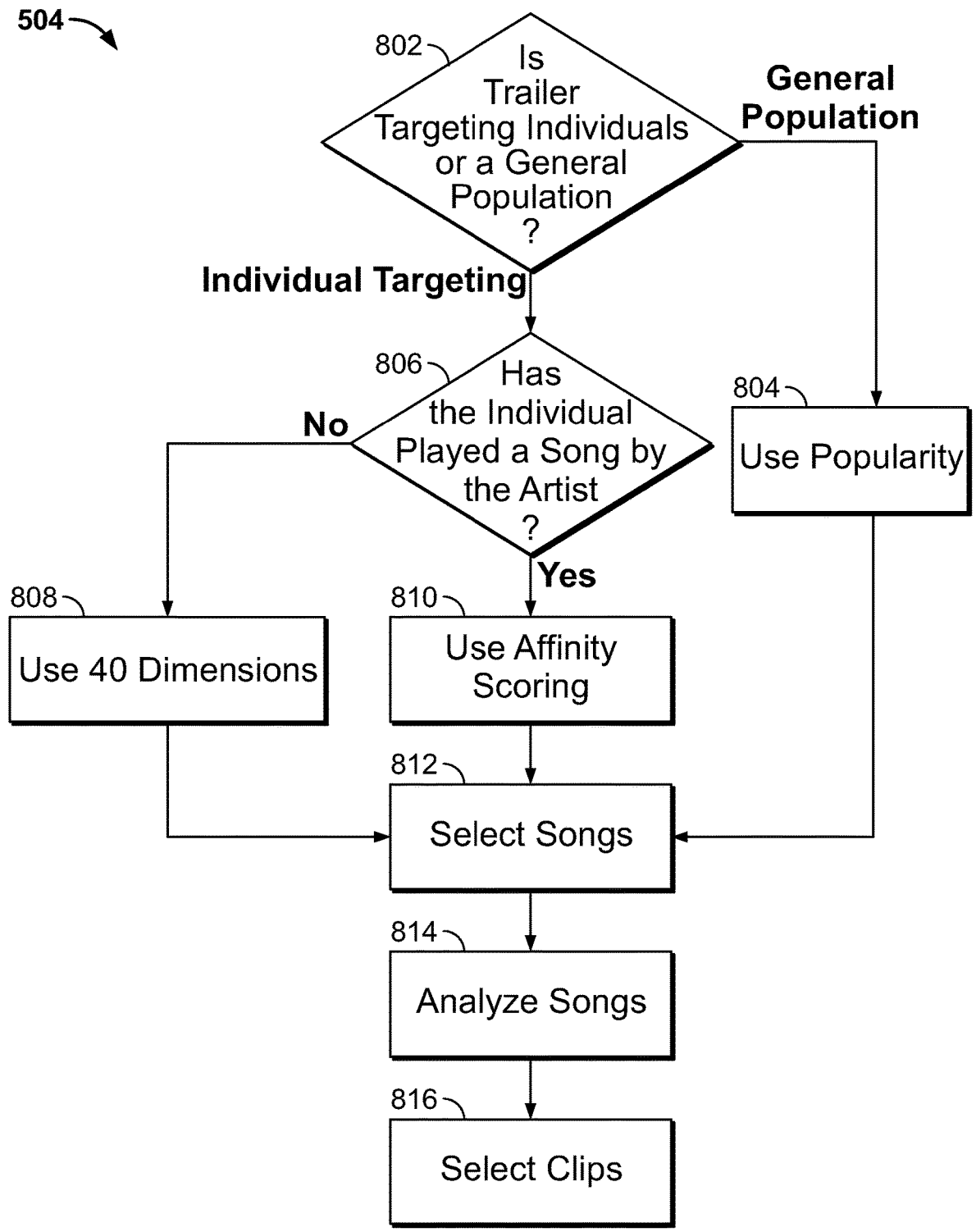
FIG. 8 illustrates an example method of automatically selecting clips of representative media items performed by some embodiments of the trailer generation application of FIG. 3.

At operation 504, the media server 106 automatically selects clips of representative media items to include in the media trailer. Media items include one or more of songs, podcast clips, portions of comedy shows, portions of audiobooks, and other media items. Multiple factors may be considered for choosing appropriate media items and which clips to select from those media items. FIG. 8 further describes the clip selection process.

At operation 506, the selected media clips are automatically assembled arranged and combined. This process is further described with respect to FIG. 11.

At operation 508, the media server 106 optionally receives additional content and integrates the content with the media clips to generate a media trailer. In some embodiments, the additional content is visual content such as an image or a video. In some embodiments, the additional content is audio content such as spoken dialogue. The visual content and/or audio content may describe a particular event associated with the one or more artists featured in the media trailer.

At operation 510, the media trailer is presented to the user. In some embodiments, the user is a promoter P using a computing device 102 to request generation of an artist trailer. In other embodiments, the media trailer is not presented to the user and is instead saved directly to the media server 106. In at least some embodiments, the media preview is presented to the user via an output device 204 on the computing device 104 such as speakers or headphones. The promoter P can review the media trailer and make changes. Upon approval, the media trailer is submitted to the media server 106 where it may be accessed by media-playback devices such as the media-playback device 112 shown in FIG. 1.

FIG. 6 illustrates an example method 502 of receiving input specifying criteria for a media trailer performed by some embodiments of the trailer generation application 108. The criteria is used to automatically generate a media trailer at the media server 106 based on input received from a user.

At operation 602, input is received from a computing device 104 specifying one or more artists. In at least some embodiments, the input is received through a user interface, such as the trailer generator user interface 700 depicted in FIG. 7. The artist selection dictates which media items will be included in the media trailer. In some embodiments, a musical artist is selected and songs by that musical artist are selected for inclusion in the media trailer. In other embodiments, multiple artists are selected because they are performing together at an event and the media preview will include songs by those artists. In other embodiments, the artist is a comedian, a spoken word actor, an audiobook author, a podcast host, or other artist.

At operation 604, input is received from the computing device 102 specifying a duration for the media trailer. In at least some embodiments, the input is received through a user interface, such as the trailer generator user interface 700 depicted in FIG. 7. In some embodiments, the duration is defined as a length of time. For example, in some embodiments, the duration of the media trailer is from 5 to 180 seconds, 10 to 150 seconds, 15 to 120 seconds, 20 to 90 seconds, or 30 to 60 seconds. In other embodiments, the duration is defined by a number of media items to be included in the media trailer. For example, in some embodiments, the media trailer is from 2 to 10 media items, 3 to 8 media items, 4 to 6 media items, or 5 media items in length.

At operation 606, input is optionally received from the computing device 102 specifying an audience for the media trailer. In some embodiments, the user of the computing device 104 can select to create a media trailer where the media content is selected for a general group or a target individual. In at least some embodiments, the input is received through a user interface, such as the trailer generator user interface 700 depicted in FIG. 7.

At operation 608, additional content is optionally received from the computing device 102. In at least some embodiments, the additional content is submitted to the media server 106 through the trailer generator user interface 700 depicted in FIG. 7. In at least some embodiments, the additional content is one or more of visual content and audio content. The visual content may be an image or a video. The audio content may be verbal audio content. In some embodiments, the additional content provides details for an event related to the one or more artists selected in operation 602.

Figure 7:
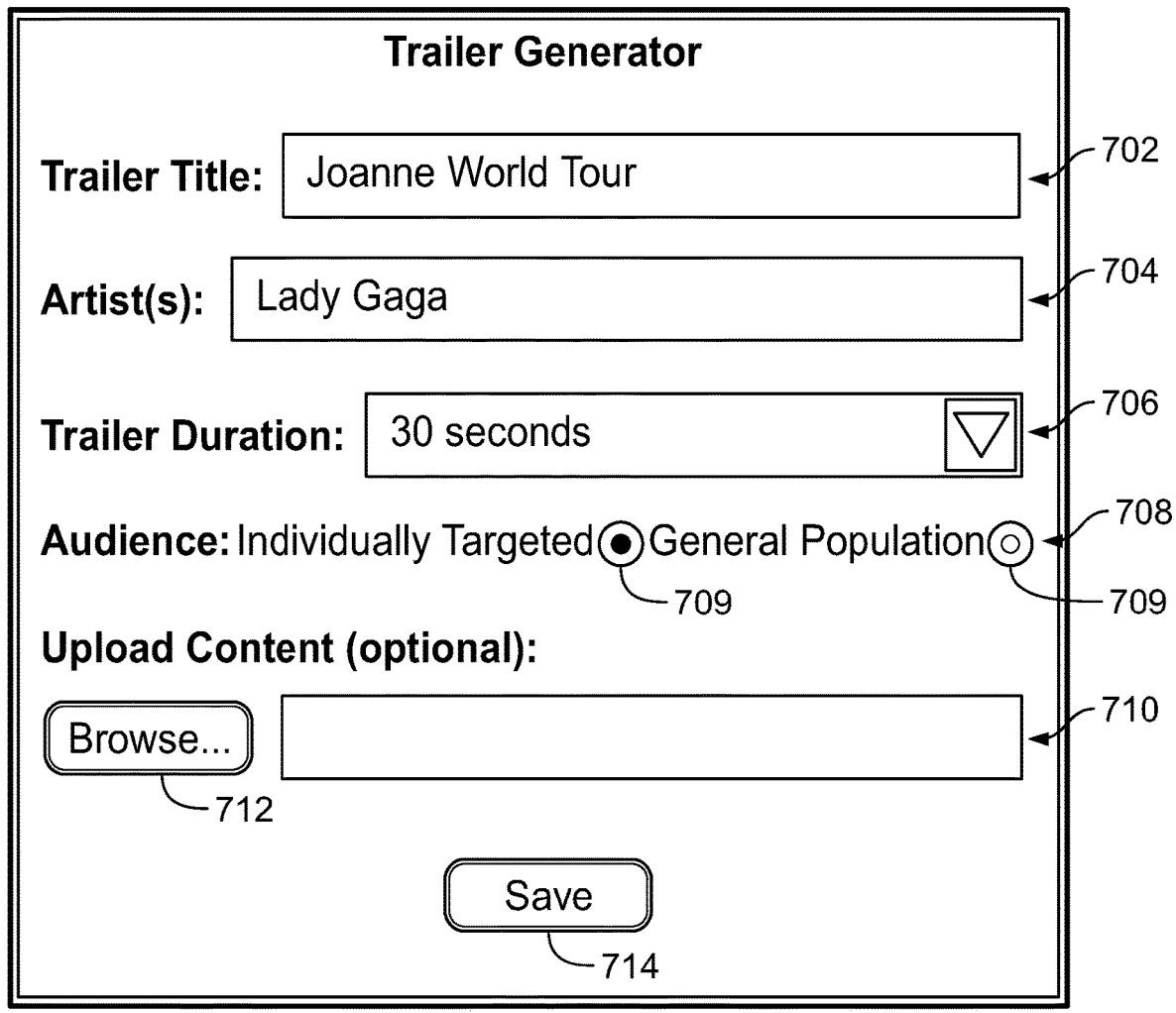
FIG. 7 illustrates a view of an example trailer generator interface implemented on the computing device of FIG. 1.

FIG. 7 illustrates an example trailer generator user interface 700 that is used in some embodiments to receive input from a promoter P at a computing device 102. The trailer generator user interface 700 is preferably a visual interface that is displayed on a computing device such as the computing device 102 depicted in FIG. 1. In some embodiments, the trailer generator user interface 700 includes a trailer title field 702, an artist field 704, a trailer duration selector 706, an audience selector 708, and a content upload field 710. Not all fields are included in all embodiments. The title field 702, audience selector 708, and content upload field 710 are optional.

In the example shown in FIG. 7, a promoter has entered a title "Joanne World Tour" into the trailer title field 702. The trailer title field 702 serves to identify the media trailer for the convenience of the promoter. In some embodiments, the promoter may create multiple media trailers for the same or different events that involve the same or different artists. Titles can be used to describe and distinguish the media trailers.

In the example shown in FIG. 7, a promoter has entered the artist "Lady Gaga" into the artist field 704. This input indicates that songs by the artist Lady Gaga should be included in the media trailer to promote her world tour. In some embodiments, the promoter can or enter two or more artists so that songs by the two or more artists would be included in the media trailer.

In the example shown in FIG. 7, a promoter has selected "30 seconds" at the trailer duration selector 706. In this example, a pull down menu is provided for the promoter to select from pre-determined choices for duration. In other embodiments, the promoter could enter any value for time in the trailer duration selector 706. For example, the media trailer could have a duration of from 5 to 180 seconds or from 30 to 60 seconds. In some embodiments, the duration is determined by selecting a number of songs or media content items to include in the media trailer.

The promoter P can optionally select an audience for the media preview by utilizing the audience selector 708. In the example of FIG. 7, radio buttons 709 are provided to allow the promoter to select either "individually targeted" or "general population" for the audience. Other selectors could be used such as a pull-down menu. Other options for audiences may be possible, such as a smaller subset of the general population limited by geography or age or targeting people who listen to the artist.

The promoter can optionally upload additional content to add to the media trailer. The content upload field 710 can be populated by selecting a file from the computing device 104. Here, the promoter would select the browse button 712 to open a window to select a file to upload. The file title or location would then appear in the content upload field 710. The additional content could be an audio file, an image file, or a video file. In some embodiments, the promoter can upload two or more additional content files.

Once the promoter 102 has input all of the desired criteria and information for the media trailer, the promoter selects the save button 714 on the trailer generator user interface 700. The trailer generator user interface 700 is just one example of how a promoter or other user might input criteria for generating a media preview or media trailer. Other alternatives and variations are possible.

FIG. 8 illustrates an example method 504 of automatically selecting clips of representative media items to include in a media trailer, as was described in FIG. 5. This method determines which media items to include in the media trailer as well as which clips of the media items to include in the media trailer.

At operation 802, the audience for the media trailer is determined. For trailers targeting individuals, the method proceeds to operation 806. For trailers targeting a general population, the method proceeds to operation 804. At operation 804, the average music taste of the general population is determined. The popularity of the media items on average is used to select the media items to include in the media preview at operation 812.

At operation 806, for media previews targeted at individuals, it is determined whether the targeted individual has played a song by the selected artist before. If the individual has played a song by the artist previously, the method proceeds to operation 810. If the individual has not played a song by the artist before, the method proceeds to operation 808. At operation 808, an example 40 dimensional method is applied to determine which media items are best suited for the individual. The 40 dimensional method utilizes comparisons between a user's vector and vectors of individual music tracks. A user's vector is created by averaging the vectors of tracks that the user has listened to, inversely weighted by recency. Vectors are obtained, for example, from an algorithm described in U.S. Pat. No. 9,547,679. Higher similarity values between the user's vector and a given track's vector indicate that the user is more likely to like the track. Other techniques or other quantities of vectors can be used in other embodiments.

At operation 810, affinity scoring is used to determine which media items are best suited for the individual. The affinity score is a measure of how much a user like a track that the user has listened to before. The score is based on the number of times the user has played the track, how long ago it was played, how often the track was played by the user, and how often the user has skipped playing the track. Higher affinity scores indicate that the user is more likely to like a song. Additional details about affinity scores are described in U.S. Pat. No. 9,547,679.

At operation 812, one of 40 dimensional scoring from operation 808, affinity scoring from operation 810, and average tastes from operation 804 are used to select the media items (songs) to include in the media trailer for the selected artist(s). Once the songs have been automatically selected, the method proceeds to operation 814.

At operation 814, the selected songs are analyzed for various aspects of their content including repetition, volume, energy, uniqueness, section boundaries, drops, beats, bars, and voice presence. This analysis identifies portions of the songs that are most recognizable to listeners such as a chorus, a hook, or another distinctive portion of the song.

Once the songs have been analyzed, clips or portions of the songs are automatically selected. If the media item is a portion of a comedy show, for example, the most recognizable portion may be a punchline of a joke. If the media item is a song, the most recognizable portion may be selected such as a chorus of the song. The clips have an automatically defined duration. The length of the clips is determined based on the overall length of the media preview and the number of media items that are included. For example, if the media preview is 30 seconds long and 5 songs are included, each clip will have an average length of 6 seconds.

Figure 9:
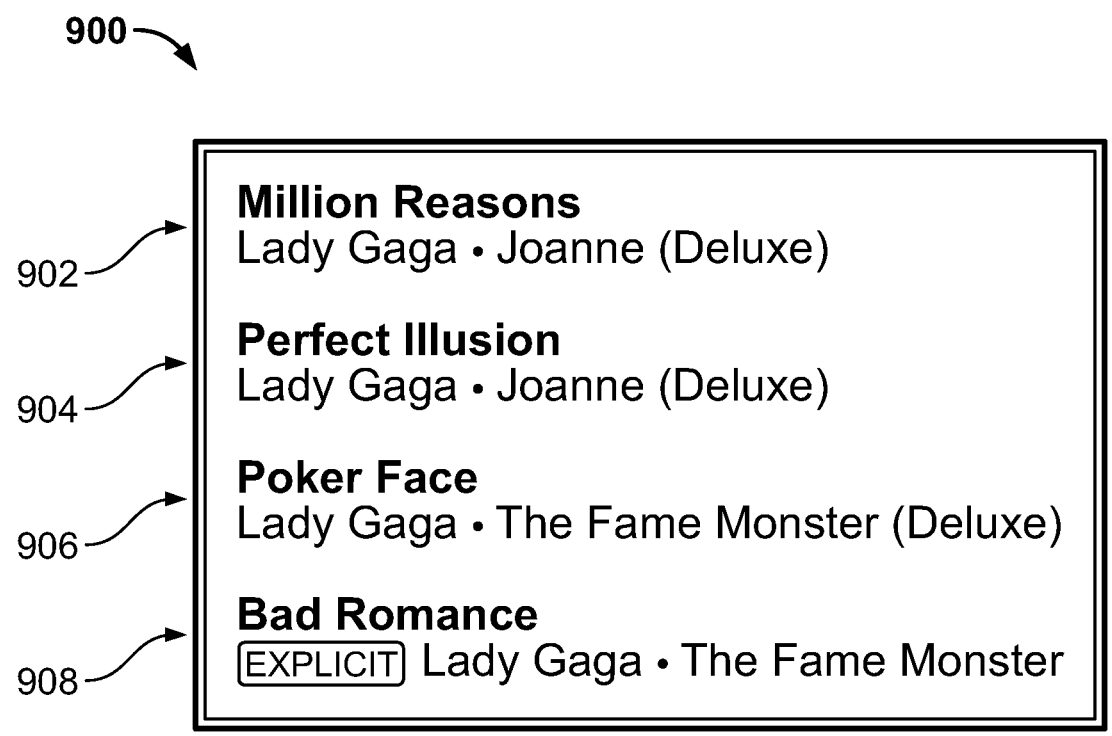
FIG. 9 show an example of media items selected to be included in a media trailer according to the method of FIG. 8.

FIG. 9 illustrates an example of song selections made according to operation 812 of the method of FIG. 8. In this example, Lady Gaga is the chosen artist and the audience is individually targeted. FIG. 9 shows that four songs (902, 904, 906, 908) have been selected to fill the 30 second duration of the media trailer. The songs shown were selected for an individual who has played Lady Gaga songs previously, so affinity scoring was used to select the songs. The affinity score 910 is displayed next to the song title in FIG. 9. The song 904 "Perfect Illusion" has an affinity score of 3, while the song 906 "Poker Face" has an affinity score of 11. This indicates that the user likes "Poker Face" more than "Perfect Illusion" based on listening behavior of the user. However, the scores of these songs are higher than other Lady Gaga songs, so lower scoring songs are not included. For example, a song with an affinity score of 2 or less would not be included in this particular media trailer.

Figure 10A:
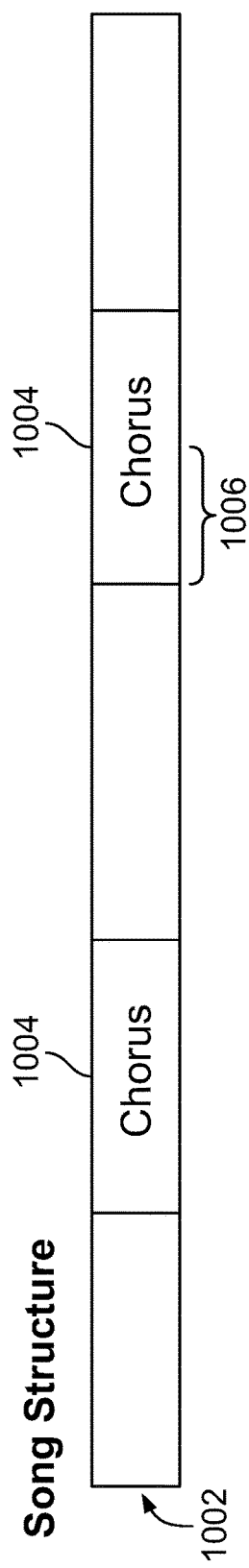
FIG. 10A illustrates example analysis to identify song structure elements performed to select clips of media items according to the method of FIG. 8.
Figure 10B:
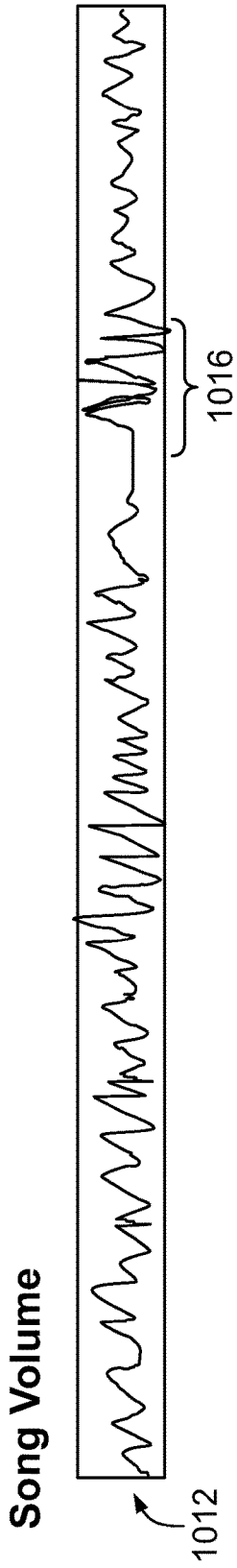
FIG. 10B illustrates example analysis of song volume performed to select clips of media items according to the method of FIG. 8.
Figure 10C:
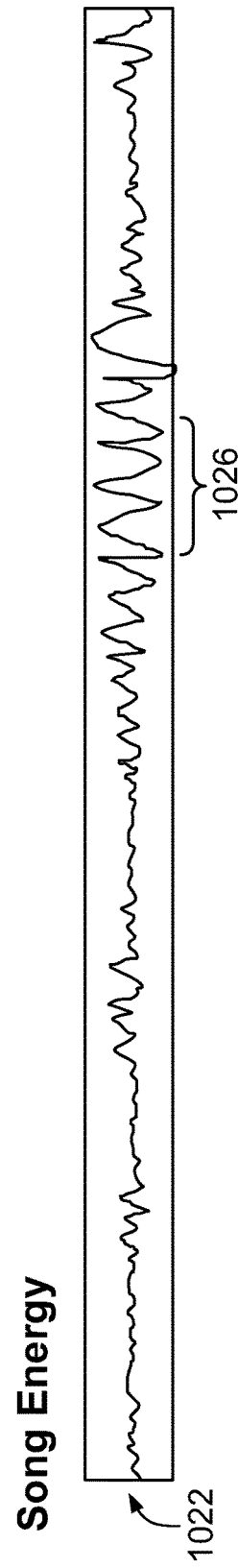
FIG. 10C illustrates example analysis of song energy performed to select clips of media items according to the method of FIG. 8.

FIGS. 10A-C illustrate the analysis and selection of clips from the selected media items to be included in the media preview according to the method of FIG. 8. Various methods of analyzing media items can be employed to identify distinctive portions of the media items. The clips can vary in duration depending on the overall duration of the media trailer and the number of media items included in the media trailer. Each clip could be from 2 to 30 seconds in duration or from 5 to 10 seconds in duration. Other durations are possible.

In FIG. 10A, the song 1002 has been analyzed to identify repetitive and higher volume portions, which here are the chorus 1004 of the song 1002. The clip 1006 is then selected from one of the chorus 1004 portions of the song. Verbal recognition can be employed to identify the beginning of a chorus or verse.

In FIG. 10B, the song 1012 has been analyzed to find a particularly distinctive portion based on volume and energy. Volume is represented in FIG. 10B by a waveform where larger peaks represent portions of the song 1012 with greater energy and volume. Here, the song is an electronic music song that does not have a lot of verbal content. The "drop," or big burst of energy following a lull in the song, has been captured in the selected clip 1016.

In FIG. 10C, the song 1022 has been analyzed for energy, which is again represented as a waveform. Energy may be a useful metric for classical music that does not have lyrics. The climax of the song is included in the selected clip 1026.

Figure 11:
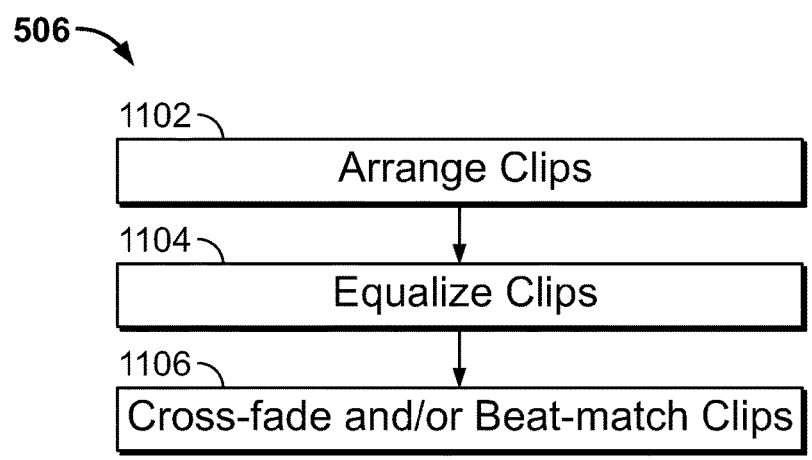
FIG. 11 illustrates an example method of automatically assembling selected media clips into a media trailer performed by some embodiments of the trailer generation application of FIG. 3.

FIG. 11 illustrates an example method 506 of automatically assembling selected media clips into a media trailer. The clips are put together to create a cohesive media presentation.

At operation 1102, the selected clips are arranged. The clips are put into a particular order based on various criteria. Such criteria could include popularity, energy, tempo, and mood.

At operation 1104, the selected clips are equalized to match the levels of the clips. Equalizing can include matching the volume, timbre, and sound quality of the media clips. Equalizing the clips makes them blend together and create smoother transitions between the clips, avoiding abrupt changes.

At operation 1106, the selected clips are blended together by cross-fading and/or beat matching. Cross-fading reduces the volume of a first clip and increases the volume of a second clip at the same time such that two clips overlap slightly. Cross-fading smooths the transitions between clips. Additionally, beat matching can be utilized to smooth transitions between clips. By matching beats, hiccups in the playback of the music can be avoided.

Figure 12:
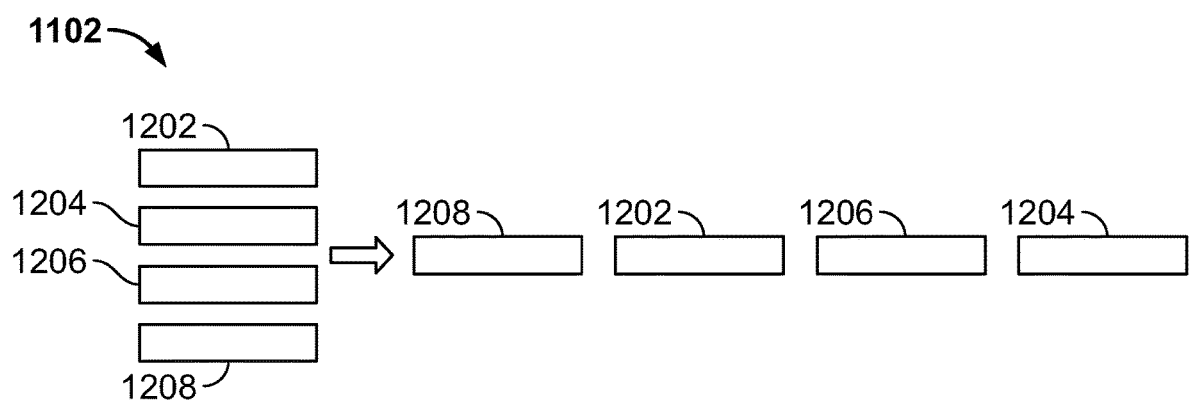
FIG. 12 illustrates the process of arranging media clips according to the method of FIG. 11.

FIG. 12 illustrates the process 1102 of arranging media clips according to the method of FIG. 11. Four clips (1202, 1204, 1206, 1208) are arranged into a particular order for the media trailer. As was described with respect to operation 1102 of FIG. 11, various criteria can be considered for choosing an order of clips such as energy, tempo, and popularity. Here, clip 1208 is first followed by 1202, 1206, and finally 1204.

Figure 13:
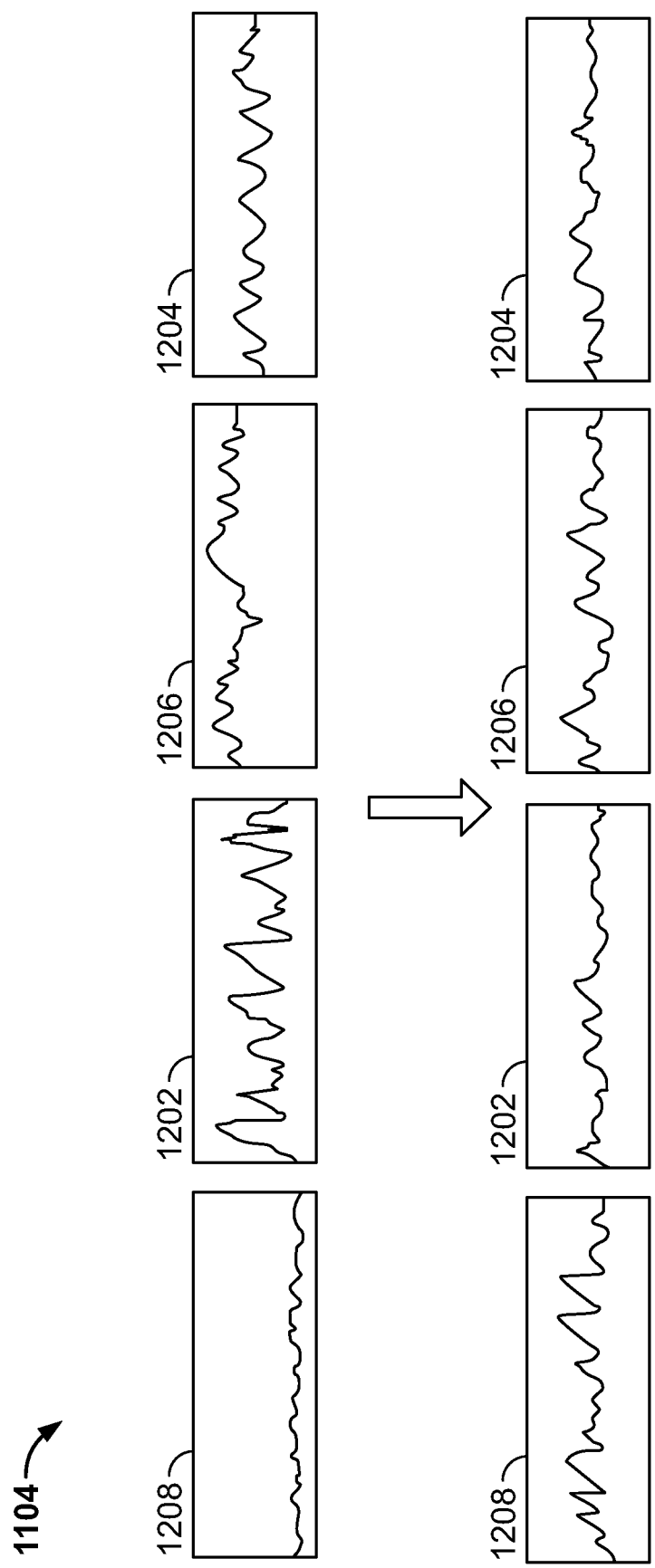
FIG. 13 illustrates the process of equalizing media clips according to the method of FIG. 11.

FIG. 13 illustrates the process 1104 of equalizing media clips according to the method of FIG. 11. The four clips (1202, 1204, 1206, 1208) are equalized. In this example, the waveforms represent volume. Other aspects of the clips can be equalized such as timbre and pitch. The clips initially have a large variation in volume, as shown by the waveforms. After equalization, the volumes of the clips are much more even.

Figure 14:
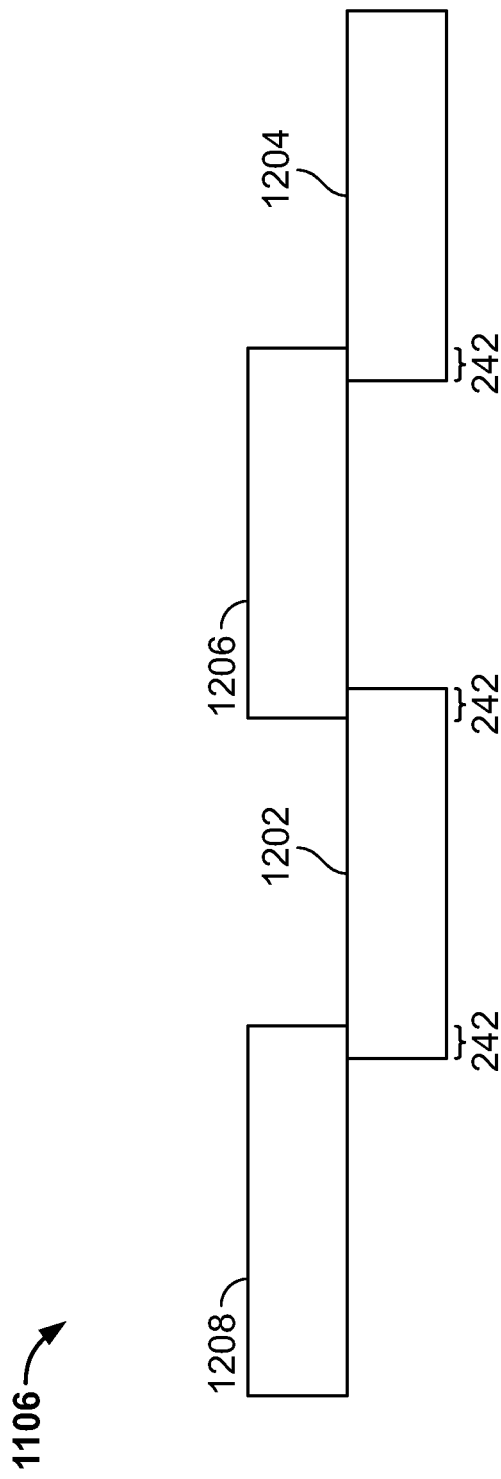
FIG. 14 illustrates the process of cross-fading between media clips according to the method of FIG. 11.

FIG. 14 illustrates the process of cross-fading between media clips according to the method of FIG. 11. Cross-fading is provided between the four clips (1202, 1204, 1206, 1208) to blend them together. The clips overlap slightly as one clip is faded out and the next clip is faded in. For example, clip 1208 fades out as clip 1202 fades in at the crossfade 1242. Other blending and smoothing operations can be utilized such as beat-matching, echo, sound effect matching, direct cut, and spinback.

Figure 15:
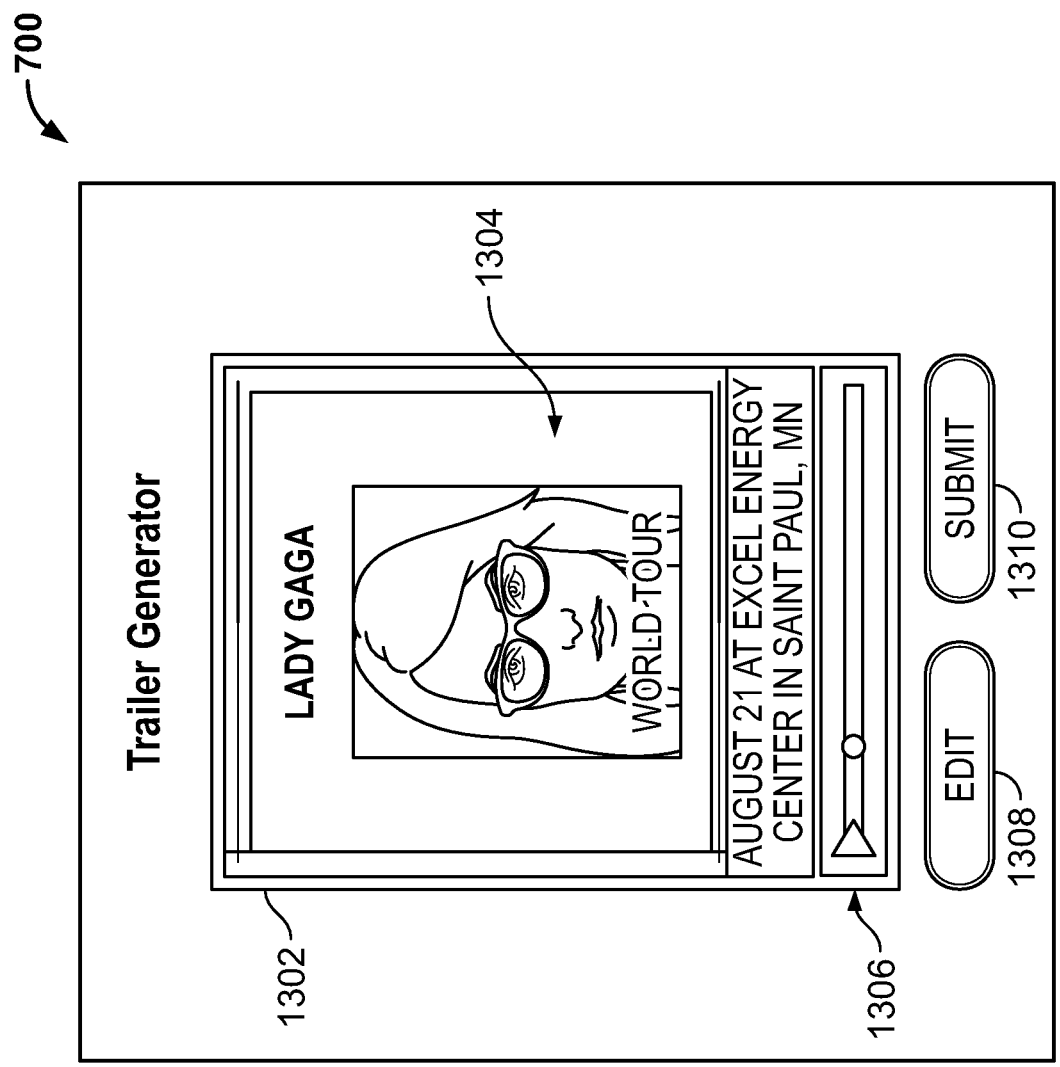
FIG. 15 illustrates an example trailer generation user interface 1300 showing a preview of the media trailer on the computing device of FIG. 1.

FIG. 15 illustrates an example trailer generation user interface 700 showing a preview of the media trailer on the computing device 104. A media player window 1302 is displayed showing the visual content 1304 that was added to the media preview. In this example, a Lady Gaga tour poster image is included with additional text information provided about a particular concert date and location. Navigation controls 1306 for the media player are provided to manipulate playback of the media preview. A user can select the "edit" button 1308 to modify the media trailer or select the "submit" button 1310 to approve of the media trailer and send it back to the media system 106 for distribution.

The completed media trailer is communicated to the media server 106 through a network 104 for storage in the media data store 316. The media trailers 352 are stored with the media content items 332. As consumers, such as consumer C, listen to media through media-playback devices 112, media content is streamed by the media stream service 314. The media stream service 314 accesses media content items 332, including media trailers 352, and communicates the media content items 332 to the consumers.

Figure 16:
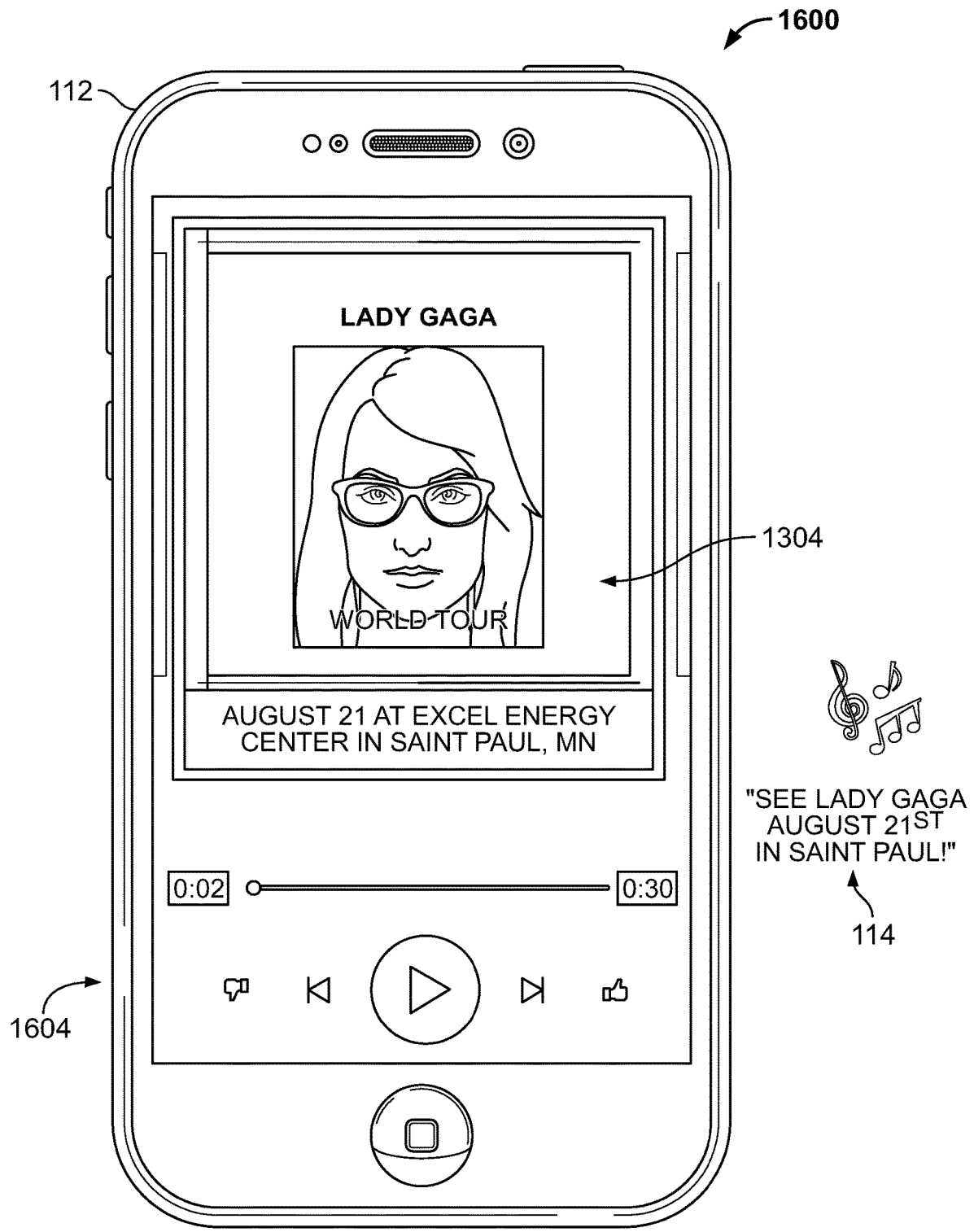
FIG. 16 illustrates an example display of a media trailer on the media-playback device of FIG. 1.

FIG. 16 illustrates an example of a display 1600 of a media trailer on a media-playback device 112. The visual content 1304 is displayed on the media-playback device 112 as the media output 114 of the media trailer is being played. The consumer C can navigate playback using the controls 1604 on the touch screen. A consumer may hear a media trailer between songs on an ad-based music streaming service.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:

1. A computer-implemented method of automatically generating a media trailer comprising:
automatically generating, with a trailer generation application, a media trailer for an event by:
determining that the event should be promoted;
determining one or more artists associated with the event;
selecting two or more representative media items for the one or more artists;
selecting a clip of each of the representative media items, wherein the clips are respective portions of the representative media items; and
arranging and equalizing the clips of the representative media items to generate the media trailer, wherein the equalizing comprises performing an audio adjustment process to cause substantial matching of one or more audio characteristics across the respective clips.

2. The computer-implemented method of claim 1, wherein automatically determining one or more artists of the event is based on metadata associated with the event.

3. The computer-implemented method of claim 1, wherein the event is one of an album release, a concert, a tour, a performance, an introduction of a new artist, a public appearance, or a combination thereof.

4. The computer-implemented method of claim 1, wherein determining that the event should be promoted is based on criteria pre-defined by a media streaming service.

5. The computer-implemented method of claim 1, wherein determining that the event should be promoted is based on criteria pre-defined by a user of the trailer generation application.

6. The computer-implemented method of claim 1, further comprising streaming the media trailer on a media streaming service to one or more media playback devices.

7. The computer-implemented method of claim 6, wherein the media trailer is streamed between two media items.

8. The computer-implemented method of claim 1, further comprising playing the media trailer on a social media platform.

9. The computer-implemented method of claim 1, wherein the two or more representative media items are selected for an individual user of a media streaming service by:
generating vector-based representations of media items;
determining the individual user's listening history on the media streaming service;
generating vector-based representations of media items in the individual user's listening history;
comparing the vector-based representations of the individual user's listening history with the vector-based representations of the media items; and
determining which of the media items have a greatest similarity to the individual user's listening history.

10. The computer-implemented method of claim 1, wherein selecting two or more representative media items for the one or more artists and selecting the clip of each of the representative media items is performed based on criteria pre-defined by the media streaming service.

11. The computer-implemented method of claim 1, wherein selecting two or more representative media items for the one or more artists and selecting the clip of each of the representative media items is performed based on criteria pre-defined by a user of the trailer generation application.

12. A system for automatically generating a media trailer, the system comprising a media server comprising:
at least one processing device; and at least one memory device including a trailer generation application and a music streaming service that, when executed by the at least one processing device, cause the media server to:
- determine that a media trailer should be generated for an event based on criteria pre-defined by the media server;
- determine one or more artists associated with the event including to access metadata associated with the event; and
- automatically generate the media trailer for the event with the trailer generation application, including to further cause the media server to:
  - select two or more representative media items for the one or more artists;
  - select a clip of each of the representative media items, wherein the clips are respective portions of the representative media items; and
  - arrange and equalize the clips of the representative media items to generate the media trailer, wherein to equalize comprises to perform an audio adjustment process to cause substantial matching of one or more audio characteristics across the respective clips.

13. The system of claim 12, wherein the processing device is further operable to cause the media server to stream media items and media trailers, with the music streaming service, to one or more media-playback devices.

14. The system of claim 12, wherein the media items are one or more of songs, podcast clips, portions of comedy shows, portions of audiobooks, or a combination thereof.

15. The system of claim 12, wherein selecting two or more representative media items for the one or more artists comprises to:
- determine a target individual user of the music streaming service; and
- analyze the media consumption history of the target individual user, including to:
  - generate a vector-based representation of the target individual user's listening history of media content items;
  - generate vector-based representations of media content items by the one or more artists;
  - compare the vector-based representation of the target individual user's listening history with the vector-based representations of the media content items by the one or more artists; and
  - determine which media content items by the one or more artists have a greatest similarity to the target individual user's listening history of media content items.

16. The system of claim 12, wherein to select two or more representative media items for the one or more artists further comprises to:
- determine a general population of the music streaming service; and
- analyze an average taste of the general population, including to:
  - determine the general population's average taste of media content items;
  - determine a popularity of media content items by the one or more artists;
  - compare the general population's average taste and the popularity of the media content items by the one or more artists; and
  - determine which media content items by the one or more artists to select based on the comparison of the general population's average taste and the popularity of the media content items by the one or more artists.

17. One or more computer readable media encoding instructions embodied thereon that, when executed by one or more computing devices, cause the one or more computing devices to:
- determine one or more artists associated with an event;
- determine that the individual has listened to a media content item by one or more of the artists associated with the event;
- determine that the event should be promoted to the individual based on determining that the individual has listened to a media content item by one or more of the artists associated with the event; and
- generate a customized artist trailer after determining that the event should be promoted to the individual, including to:
  - select two or more representative media items for the one or more artists;
  - select a clip of each of the representative media items, wherein the clips are respective portions of the representative media items; and
  - arrange and equalize the clips of the representative media items to generate the customized artist trailer, wherein the equalizing comprises performing an audio adjustment process to cause substantial matching of one or more audio characteristics across the respective clips.

18. The computer readable media of claim 17, wherein the instructions further cause the one or more computing devices to: stream the customized artist trailer to a media-playback device associated with the individual.

19. The computer readable media of claim 17, wherein to determine that the event should be promoted to the individual is based on criteria pre-defined by a media streaming service.

20. The computer readable media of claim 17, wherein to determine that the event should be promoted to the individual is based on criteria pre-defined by a user of a trailer generation application.

\* \* \* \* \*